United States Patent
Lepine et al.

(10) Patent No.: US 9,400,292 B2
(45) Date of Patent: Jul. 26, 2016

(54) ELECTRICAL CURRENT SENSOR WITH GROUNDED MAGNETIC CORE

(75) Inventors: Gérard Lepine, Peillonex (FR); Vinh Tho Vo, Meyrin (CH); Arnaud Labbe, St Girod (FR)

(73) Assignee: LEM Intellectual Property SA, Fribourg (CH)

( * ) Notice: Subject to any disclaimer, the term of this patent is extended or adjusted under 35 U.S.C. 154(b) by 116 days.

(21) Appl. No.: 14/232,197

(22) PCT Filed: Jul. 12, 2012

(86) PCT No.: PCT/IB2012/053581
§ 371 (c)(1),
(2), (4) Date: May 14, 2014

(87) PCT Pub. No.: WO2013/008205
PCT Pub. Date: Jan. 17, 2013

(65) Prior Publication Data
US 2014/0253100 A1  Sep. 11, 2014

(30) Foreign Application Priority Data

Jul. 13, 2011 (EP) .................................... 11173799

(51) Int. Cl.
*G01R 15/20* (2006.01)
*G01R 19/00* (2006.01)
(52) U.S. Cl.
CPC .............. *G01R 19/00* (2013.01); *G01R 15/207* (2013.01)
(58) Field of Classification Search
CPC ........................................ G01R 15/20–15/207
USPC .................................. 324/117 H, 117 R, 251
See application file for complete search history.

(56) References Cited

U.S. PATENT DOCUMENTS

| | | | | |
|---|---|---|---|---|
| 3,007,106 A | * | 10/1961 | Bergh | .................... G01R 19/20 323/358 |
| 5,552,700 A | * | 9/1996 | Tanabe | ............... G01R 19/0092 324/117 H |

(Continued)

FOREIGN PATENT DOCUMENTS

| EP | 2073025 A1 | 6/2009 |
|---|---|---|
| EP | 2302402 A1 | 3/2011 |

(Continued)

OTHER PUBLICATIONS

"Magnetic Cores for Hall Effect Devices," Technical Bulletin HED-01, © 1997, Magnetics, Division of Spang & Company, Butler, PA; XP002666398; www.mag-inc.com/; 6 pages.

(Continued)

*Primary Examiner* — Patrick Assouad
*Assistant Examiner* — Demetrius Pretlow
(74) *Attorney, Agent, or Firm* — Faegre Baker Daniels LLP

(57) ABSTRACT

An electrical current transducer comprising a housing, at least one magnetic core comprising an air gap and defining a central passage configured to receive a primary conductor carrying a primary current to be measured through the central passage, a magnetic field detector positioned at least partially in the air gap, and a grounding element. A lateral surface of the magnetic core is positioned against the grounding element without direct fixed attachment between the magnetic core and the grounding element, and the grounding element overlaps the magnetic core to an extent configured to ensure that a capacitive coupling (C3) between the magnetic core and the grounding element is greater than a capacitive coupling (C2) between the magnetic core and the magnetic field detector.

14 Claims, 4 Drawing Sheets

(56) References Cited

U.S. PATENT DOCUMENTS

| | | | | |
|---|---|---|---|---|
| 5,694,103 | A * | 12/1997 | Goodwin | G01R 21/08 324/117 H |
| 6,348,800 | B1 * | 2/2002 | Haensgen | G01R 31/024 324/117 H |
| 6,426,617 | B1 * | 7/2002 | Haensgen | G01R 15/202 324/117 H |
| 7,821,252 | B2 * | 10/2010 | Lepine | G01R 15/207 324/117 H |
| 2003/0112000 | A1 * | 6/2003 | Sorenson, Jr. | G01R 15/181 324/126 |
| 2005/0237049 | A1 * | 10/2005 | Ozaki | G01R 15/202 324/117 H |
| 2006/0176047 | A1 * | 8/2006 | Lepine | G01R 15/207 324/117 R |
| 2006/0232262 | A1 * | 10/2006 | Tanizawa | G01R 15/183 324/117 H |
| 2008/0174970 | A1 | 7/2008 | Rees et al. | |
| 2010/0265027 | A1 * | 10/2010 | Demolis | H01F 3/04 336/213 |
| 2010/0315066 | A1 | 12/2010 | Hashio et al. | |

FOREIGN PATENT DOCUMENTS

| | | |
|---|---|---|
| EP | 2333567 A2 | 6/2011 |
| JP | H 0462482 A | 2/1992 |
| JP | H 04250365 A | 9/1992 |
| JP | H 0538573 U | 5/1993 |
| JP | H 09127159 A | 5/1997 |
| JP | 2007202320 A | 8/2007 |

OTHER PUBLICATIONS

International Search Report and Written Opinion issued by the European Patent Office, dated Dec. 14, 2012, for related International Application No. PCT/IB2012/053581; 13 pages.

* cited by examiner

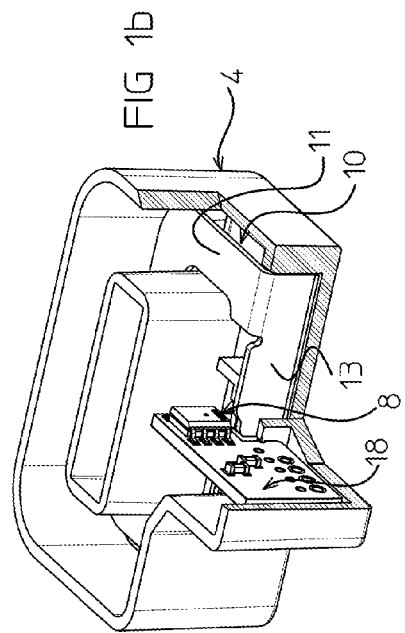
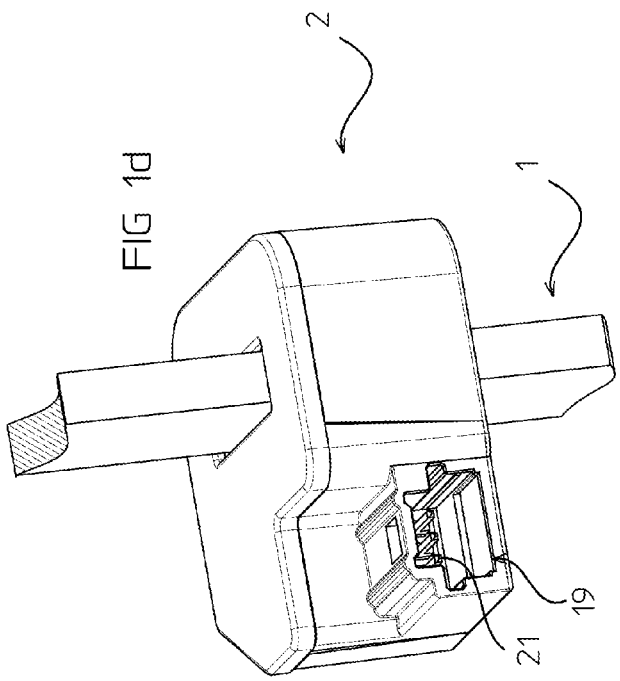
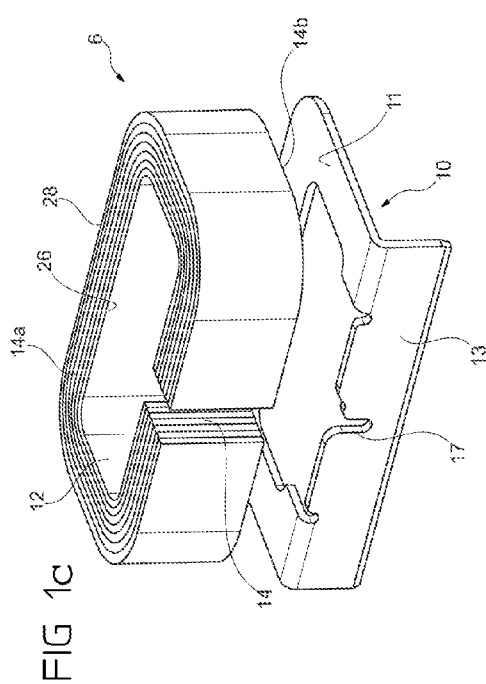
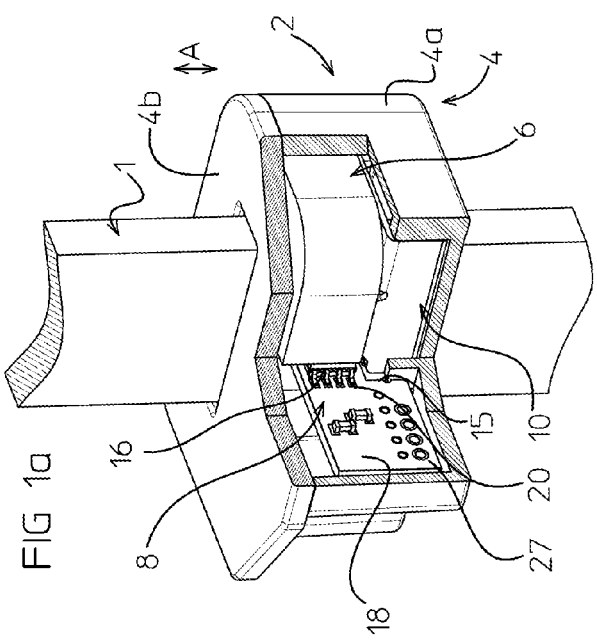

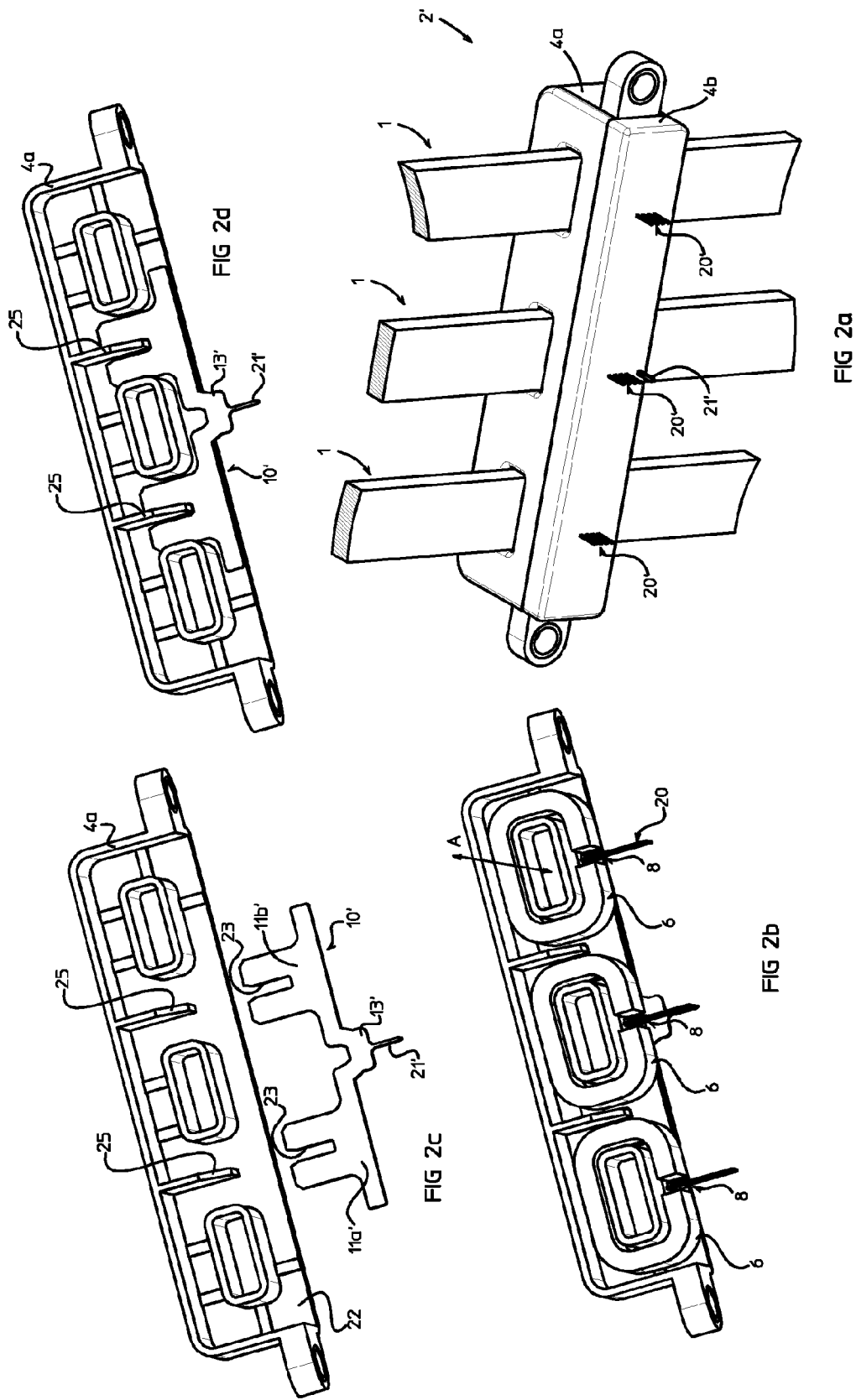

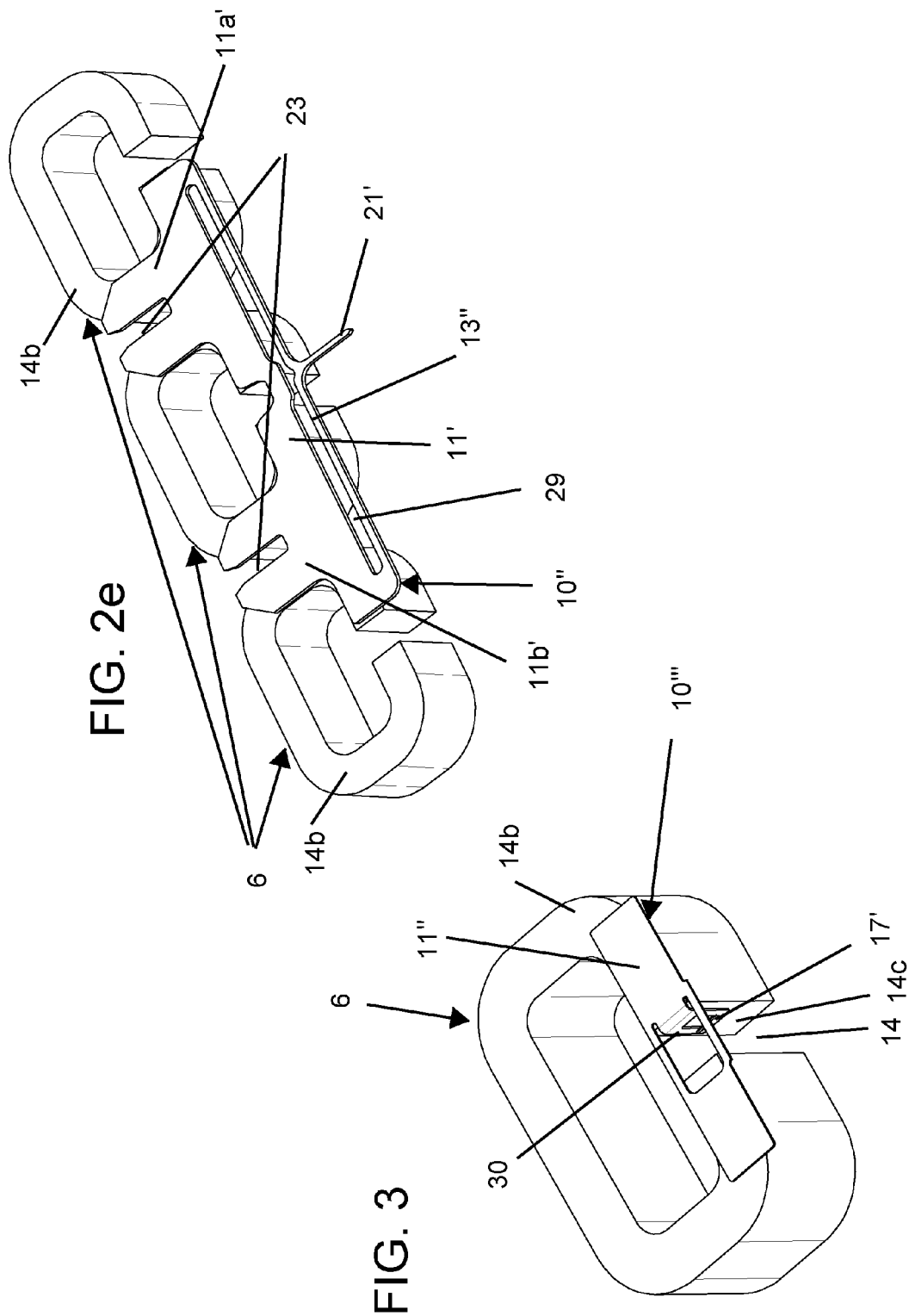

ELECTRICAL CURRENT SENSOR WITH GROUNDED MAGNETIC CORE

The present invention relates to an electrical current sensor with a grounded magnetic core.

BACKGROUND OF THE DISCLOSURE

Electrical current transducers for current sensing applications typically comprise a magnetic core made of a high permeability magnetic material, surrounding a central cavity through which passes a primary conductor carrying the current to be measured. The magnetic core may typically have a generally rectangular or circular shape and be provided with an air-gap in which a magnetic field sensor, such as a Hall effect sensor, is positioned. The magnetic flux generated by the electrical current flowing in the primary conductor is concentrated by the magnetic core and passes through the air-gap. The magnetic field in the air-gap is representative of the primary current. In current transducers of the open-loop type, the magnetic field sensor in the air-gap generates an image of the current to be measured that represents the measurement signal. In current sensors of the closed-loop type the magnetic field sensor is connected in a feed-back loop to a coil that is typically wound around a portion of the magnetic core in order to generate a compensation current that tends to cancel the magnetic field generated by the primary conductor. The compensation current thus represents an image of the current to be measured. A fluctuating voltage or current in the primary conductor may adversely influence the measurement signal because of the capacitive coupling between the primary conductor and the magnetic core. A difference in potential between the magnetic core and the measurement signal processing circuit may also adversely influence the measurement signal and it is therefore common to connect the magnetic circuit electrically to a reference voltage, namely ground, of the signal processing circuit.

In certain conventional current transducers, a ground terminal is crimped to the magnetic core for establishing the ground connection. It may also be known to solder a ground connection to the magnetic core, or employ other direct electrical connections.

The electrical connection to the magnetic core increases the cost of manufacturing and assembling the magnetic core, and may also affect the magnetic properties (magnetic permeability) of the material of the core. Also, the electrical connection to the magnetic core, depending on the type of core and application, may be susceptible to rupture, for example through wear and vibrations, leading to a faulty electric current measurement signal that goes unnoticed, or requires replacement of the sensor.

It is known to provide a ground plane on a circuit board on which the magnetic core is mounted, as described in JP0462482. In view of the large surface area of the circuit board and the relatively high mass of the magnetic core, this configuration is however costly and not sufficiently robust for certain applications, in particular when subjected to vibration, mechanical shocks and large thermal operating ranges

SUMMARY OF THE DISCLOSURE

An object of this invention is to provide an electrical current transducer for electrical current sensing that is economical to produce and assemble, and that is reliable and robust.

It is advantageous to provide an electrical current transducer for measuring fluctuating currents that produces a reliable measurement signal.

It is advantageous to provide an electrical current transducer that is compact and flexible in configuration.

It is advantageous to provide an electrical current transducer that is compact, economical and reliable, and that is able to measure a plurality of phases, for example three phases, or the current flowing in a plurality of primary conductors, in a single compact arrangement.

Objects of the invention have been achieved by providing a current transducer according to claim 1.

Disclosed herein is an electrical current transducer comprising a housing, at least one magnetic core comprising an air gap and defining a central passage configured to receive a primary conductor carrying a primary current to be measured through the central passage, a magnetic field detector positioned at least partially in the air gap, and a grounding element. A lateral surface of the magnetic core is positioned against the grounding element without direct conductive fixed attachment between the magnetic core and the grounding element. The grounding element is mounted in the housing and held relative to the magnetic core by means of the housing. The grounding element is stamped from sheet metal and overlaps the magnetic core to an extent configured to ensure that a capacitive coupling (C3) between the magnetic core and the grounding element is greater than a capacitive coupling (C2) between the magnetic core and the magnetic field detector and that the capacitive coupling (C3) between the magnetic core and the grounding element is comparable or greater than the capacitive coupling (C1) between the primary conductor and the magnetic core.

The above described configuration of a stamped and formed grounding element assembled next to one or more magnetic cores in a dielectric housing, where the capacitive coupling is sufficient to ensure grounding connection of the magnetic core even without direct electrical conductive connection, or where such connection is poor due to high resistance, is economical to produce and assemble, and is robust and reliable. Such configuration is also particularly advantageous for various types of magnetic cores that are not easy or economical to connect to ground by a welded or soldered conductive connection, or that do not provide a reliable connection by direct conductive pressing contact because of poor surface conduction, for instance due to the presence of an insulating material or due to oxidation of the surface. Examples of such magnetic cores are cores made of ferrite and toroidal cores made of a wound strip of magnetic material that material that is impregnated with a resin to hold the layers of material together, especially once the air gap is formed. Wound cores of the aforementioned type are particularly cost effective to produce, however are not easy or economical to connect to ground by a direct conductive connection. The stamped and formed grounding element is cost effective to manufacture while also being very robust. The stamped and formed grounding element also offers the possibility of integrally incorporating a contact terminal for direct plugging connection to a complementary grounding contact of an external connector, or for contacting a conductive pad of a circuit board carrying the magnetic field detector inserted in the air gap of the magnetic core.

Preferably the grounding element overlaps the magnetic core to an extent configured to ensure that a capacitive coupling between the magnetic core and the grounding element is at least 150% greater than a capacitive coupling between the magnetic core and the magnetic field detector, more preferably at least 200% greater than a capacitive coupling between the magnetic core and the magnetic field detector, more preferably at least 500% greater than a capacitive coupling between the magnetic core and the magnetic field detector.

The capacitive coupling (C3) between the magnetic core and the grounding element is preferably greater than the capacitive coupling (C1) between the primary conductor and the magnetic core, preferably at least 150%, more preferably at least 200%, yet more preferably at least 300%.

A portion of the lateral surface of the magnetic core overlapping the grounding element is greater than a surface area of the magnetic field sensor in the air-gap, preferably at least two times greater than said surface area of the magnetic field sensor in the air-gap.

In an advantageous embodiment, the magnetic core is made of a wound strip of thin high magnetic permeability sheet material so as to form stacked concentric ring layers, from a radially innermost ring layer to a radially outermost ring layer.

The air gap of the magnetic core may completely cut through the stacked concentric ring layers.

In an embodiment, the current transducer may comprise a plurality of magnetic cores each configured to receive a primary conductor carrying a primary current to be measured through the central passage of each magnetic core, whereby there is a single common grounding element capacitively coupled to the plurality of magnetic cores.

The grounding element may be positioned on a floor of the housing and the magnetic core or cores positioned on the grounding element, either directly against or separated by a thin layer of material. The grounding element may comprise positioning elements, such as slots, that cooperate with complementary positioning elements, such as protuberances, of the housing.

Further objects and advantageous aspects of the invention will be apparent from the claims and the following detailed description of exemplary embodiments of the invention, and in the annexed figures, in which:

BRIEF DESCRIPTION OF THE DRAWINGS

FIG. 1a is a view in perspective of an electrical current transducer according to an embodiment of this invention with partial cross-section through a housing of the transducer;

FIG. 1b is a view in perspective of part of the current transducer of FIG. 1a, without the primary conductor, cover part and magnetic core;

FIG. 1c is a view in perspective of the magnetic core and grounding member of the transducer of FIG. 1a;

FIG. 1d is a view in perspective of an electrical current transducer according to an embodiment of this invention;

FIG. 2a is a view in perspective of a multi-conductor current transducer according to an embodiment of the invention;

FIG. 2b is a view in perspective of part of the current transducer of FIG. 2a without primary conductors and a housing cover part removed;

FIG. 2c is an exploded view in perspective of a housing base part and grounding member of the transducer of FIG. 2a;

FIG. 2d is a view similar to FIG. 2c with the grounding member mounted to the housing base part;

FIG. 2e is a view in perspective of a the multi-conductor current transducer showing only the magnetic cores and grounding element, illustrating a variant of the grounding element;

FIG. 3 is a view in perspective of a grounding element and magnetic core of a current transducer according to another embodiment.

DETAILED DESCRIPTION

Figure 4:
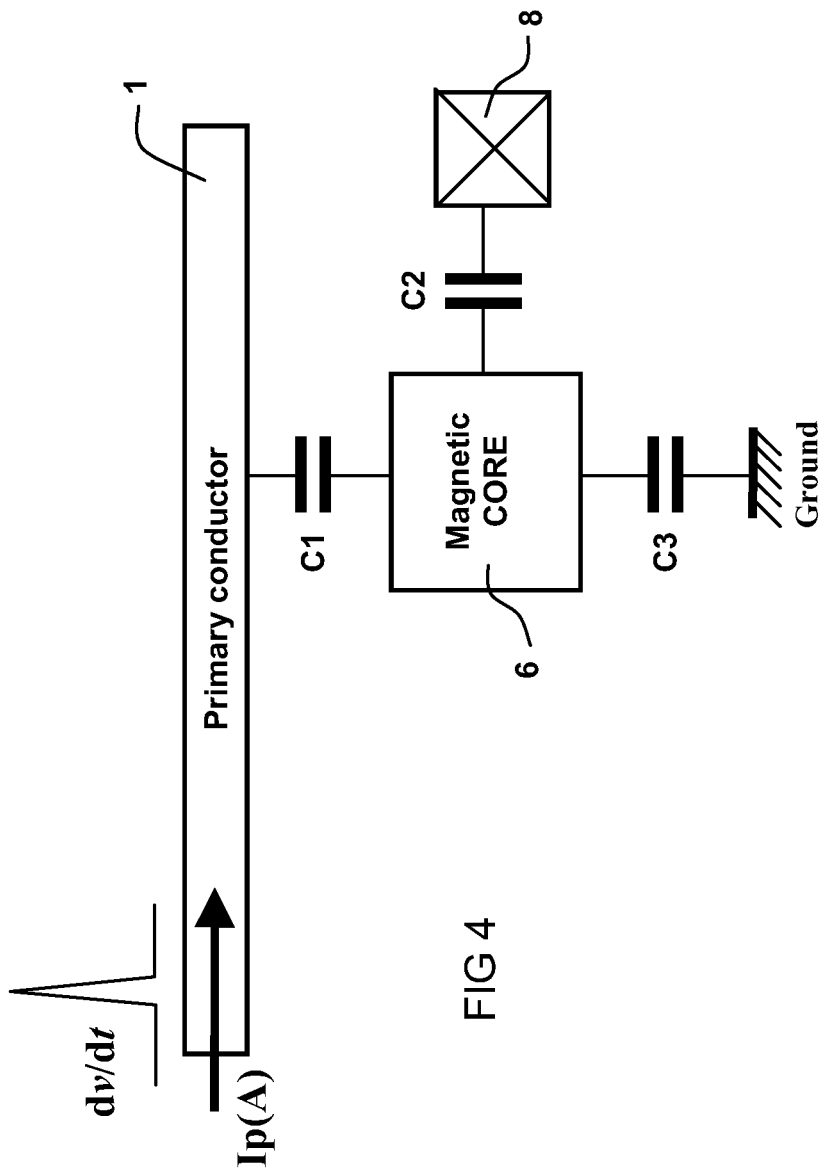
FIG. 4 is a simplified electrical diagram of a grounded transducer core according to this invention.

Referring to the figures, in particular FIGS. 1a-1d, an electrical current sensor 2 comprises a housing 4, a magnetic core 6, a magnetic field detector 8, and a grounding element 10, 10', 10", 10'''.

In a preferred embodiment, the magnetic core 6 is made of a wound strip of thin high magnetic permeability sheet material so as to form stacked concentric ring layers, from a radially innermost ring layer 26 to a radially outmost ring layer 28. The thin edges of the strip layer define opposed lateral sides 14a, 14b of the magnetic core. Magnetic materials with high magnetic permeability are known and for instance include FeSi or FeNi alloys.

The magnetic core may also be formed from a stack of sheets of a material with high magnetic permeability, or of single piece ferrite, as is well-known in the art.

The magnetic core surrounds an opening or passage 12 intended to be traversed by a primary conductor 1 through which the current to be measured flows. The magnetic core 6 has an air gap 14, which in the embodiment illustrated completely cuts through the magnetic core. Within the scope of this invention the air gap could however also be a partial air gap whereby the magnetic core forms a closed or essentially closed magnetic circuit.

The magnetic field detector 8 comprises a magnetic field sensor 16 and a circuit board 18 on which the magnetic field sensor 16 is mounted. The magnetic field sensor may for example be a Hall effect sensor in the form of an ASIC with contact terminals 20 connected to conductive tracks on the circuit board 18. Hall effect sensor chips are widely used, but other known magnetic field sensors could also be employed within the scope of this invention, such as giant magneto-resistive magnetic field sensors, fluxgate sensors, and other known magnetic field sensors. The magnetic field sensor does not necessarily need to be mounted on a circuit board: it could also be encapsulated or incorporated in a housing or other support structure with electrical terminals for connection to an external unit for processing the measurement signal.

The wound magnetic core is particularly advantageous because it is very economical to manufacture, being wound from a simple strip of soft magnetic material, with the air-gap being formed by a cut through the wound core, while also providing a laminated structure that limits Eddy currents.

Wound magnetic cores are however difficult to connect to ground and conventionally rely on a welded or soldered connection of a terminal on the magnetic core. Such soldered or welded connections are subject to rupture due to vibration, shock, corrosion, or thermally induced stresses.

The grounding element 10, 10', 10", 10''' of the present invention overcomes these drawbacks by offering a capacitive coupling between the magnetic core and the grounding element, in other words, an indirect electrical coupling by a capacitive effect. With reference to FIG. 4, the grounding element 10, 10', 10", 10''' has a surface area capacitively coupled to the magnetic core 6 with a capacitance C3 that is comparable or greater than the capacitive coupling capacitance C1 between the primary conductor 1 and the magnetic core, and significantly greater than the capacitive coupling capacitance C2 between the magnetic field sensor 8 and the core 6. Preferably the capacitive coupling C3 of the grounding element 10, 10', 10", 10''' to the magnetic core 6 is at least 80% of the capacitive coupling C1 between the primary conductor 1 and the magnetic core, and the capacitive coupling C3 of the grounding element to the magnetic core is at least 150%, preferably at least 200% of the capacitive coupling C2 between the magnetic field sensor 8 and the magnetic core, configured to ensure that the effects of a change in voltage in the primary conductor dv/dt that generate a current pulse in the core is effectively grounded so as to have a negligible effect on the inherent capacitive coupling between the magnetic field sensor and the magnetic core. The aforementioned capacitive coupling avoids the capacitively induced effect of a rate of change of voltage dv/dt in the primary conductor on the magnetic field sensor by capacitive coupling through the magnetic core.

The capacitive coupling C3 between the grounding element 10, 10', 10", 10''' and the magnetic core 6 is thus configured to be greater, preferably significantly greater than the inherent capacitive coupling C2 between the magnetic field sensor in the air-gap and the magnetic core and also preferably greater than the capacitive coupling C1 between the primary conductor 1 and the magnetic core 6. For an effective capacitive coupling, the grounding element 10, 10', 10", 10''' preferably lies against the magnetic core, the surface of grounding element overlapping the magnetic core being greater than the surface area of the magnetic field sensor in the air-gap, preferably at least two times greater.

In an advantageous embodiment, as illustrated in FIGS. 1a to 1c, and 2a to 2d, the grounding element is positioned against a lateral side 14a, 14b of the wound magnetic core and preferably covers at least 10% of the lateral side, preferably more than 20% of the surface area of the lateral side.

In the embodiment of FIGS. 1a to 1d, the grounding element 10 comprises a base portion 11 and a common bridging portion 13. The base portion 11 is configured to lie against a lateral surface 14b of the magnetic core 6, in order to capacitively couple the grounding element with the magnetic core, whereas the bridging portion 13 interconnects the base portion 11 to a grounding terminal of a signal processing circuit for external electronics to which the signal processing circuit is connected. In the embodiment of FIGS. 1a to 1c, the bridging portion 13 is electrically connected to conductive pads on the circuit board 18, the grounding pad terminals 15 being provided on either side of the circuit board and the circuit board inserted in a grounding contact slot 17 in the bridging portion 13 of the grounding element 10. The grounding contact 17 of the bridging portion can also be provided with resilient contact arms or other known connection terminal shapes complementary to a grounding pad or a grounding contact or terminal on the circuit board 18. The grounding terminal pad 15 on the circuit board 18 is connected through circuit traces to a contact portion 27 to which is connected a grounding terminal 21 for pluggable connection to external circuitry. The grounding terminal 21 is part of a connector 19 of the sensor 2, the connector comprising other terminals for the measurement signal and possibly also for power supply of the circuit board.

In the embodiment of FIGS. 2a to 2d, which shows a three-phase or triple conductor current transducer, the grounding element 10' has a bridging portion 13' with a single pin terminal 21' for connection to external circuitry. The grounding element 10' thus has a connection terminal 21' that is directly connectable to external circuitry without transiting through the circuit board of the magnetic field detector. Each magnetic field sensor 8 may also comprise terminals 20' configured for direct connection to external circuitry. The base grounding portion 11' of this second embodiment has two portions 11 a', 11 b' interconnected by the bridging portion 13', the bridging portion and base grounding portion 11' being integrally formed as a single piece in a planar or substantially planar manner cut out of sheet metal, offering a very cost effective and robust construction. The grounding construction. The grounding element may be provided with positioning elements such as slots 23 that cooperate with complementary positioning elements 25, for instance in the form of protuberances 25 of the housing. The positioning elements 25 may be integrally formed with a part of the sensor housing 4, for example a sensor housing base portion 4a. It may be noted that within the scope of the invention, it is possible to have a transducer with less than three conductor measuring portions or four or more conductor measuring portions according to the same design principles as for the exemplary triple conductor current transducer illustrated in FIGS. 2a-2d.

In the embodiment of FIGS. 2a to 2d, the base grounding portions 11a' and 11b' overlap the surface area of a lateral side 14b of each magnetic core 6 partially, in an amount between 20% and 40% of the magnetic core lateral side 14b surface area. In the embodiment of FIGS. 1a to 1d, the base grounding portion 11 overlaps the surface area of the grounding core lateral side 14b in an amount over 60% of the lateral side 14b surface area.

FIG. 2e illustrates an embodiment similar to the embodiment of FIGS. 2a-2d except that the grounding element 10" is slightly different. In this variant, the connection terminal 21' is mounted on a beam 13" that is integrally connected at both ends to the base portions 11a', 11b' and separated therefrom by a gap 29. The beam and gap allows some low stress adjustment of the position of the connection terminal 21' relative to the base portions, to absorb manufacturing and assembly tolerances or different thermal expansion of the housing and grounding element.

Referring to FIG. 3, another embodiment is illustrated in which the grounding element 10''' is made of a stamped and formed sheet metal and has an essentially planar base 11" that is mounted against a branch of the magnetic core that comprises the air gap 14 such that the base 11" spans across and over the air gap. The grounding element 10''' comprises a tab 30 bent out of the base and positioned against a face 14c of the magnetic core defining one side of the air gap 14. A grounding contact 17', for instance in the form of a leaf spring contact protrudes from the tab 30, configured to bias against a grounding contact pad of a circuit board, such as the circuit board 18 illustrated in FIG. 1a carrying the magnetic field detector. Although FIG. 3 illustrates a single magnetic core, it is possible to have a plurality of cores (e.g. as in the embodiment of FIG. 2b) and a single grounding element comprising a single strip extending across all cores with bent out tabs in each air gap. Alternatively, each core may have a separate grounding element.

The grounding element 10, 10', 10", 10''' of the various embodiments shown may advantageously be assembled in the housing base portion 4a in an axial direction A, corresponding also to the axial direction of insertion and assembly of the magnetic core 6 and possible also of the magnetic field sensor 8 into the housing. The grounding element may be simply positioned on a floor of the housing base part 4b and the magnetic core 6 simply positioned on the grounding element, either directly against or separated by a thin layer of material, without being fixed directly together by means of a conductive fixed (permanent) attachment such that the grounding of the magnetic core relies solely or principally on the capacitive coupling between the magnetic core and the grounding element. The housing 4 thus performs the function of holding the grounding element and the magnetic core 6 together. This simple assembly without direct conductive fixed attachment (by which is meant welding, soldering, conductive adhesive bonding, riveting, crimping or other direct permanent conductive coupling between the two parts) simplifies manufacturing and assembly of the transducer as well as allowing use of a low cost toroidal magnetic core or of a single piece ferrite magnetic core. The inside of the housing may be filled by a resin or other filling material per se well known in current transducer design, and the housing closed by a cover part 4b mounted against the base part 4a.

In a variant, a portion of primary conductor 1 may be integrated in the current transducer and form part of the current transducer. In the latter variant the conductor carrying the current to be measured is connected to ends of the primary conductor portion. The primary conductor portion may consist of a single bar or wire extending through the central passage 12 of the magnetic core, or may comprise one or more windings encircling a portion of the magnetic core and passing through the central passage.

The invention claimed is:

1. An electrical current transducer comprising a housing, at least one magnetic core comprising an air gap and defining a central passage configured to receive a primary conductor carrying a primary current to be measured through the central passage, a magnetic field detector positioned at least partially in the air gap, and a grounding element, wherein the grounding element is stamped from sheet metal and a lateral surface of the magnetic core is positioned against the grounding element in the housing without direct conductive fixed attachment between the magnetic core and the grounding element, and the grounding element overlaps the magnetic core to an extent configured to ensure that a capacitive coupling (C3) between the magnetic core and the grounding element is at least 5 times greater than a capacitive coupling (C2) between the magnetic core and the magnetic field detector, whereby the magnetic core is connected to ground only via said capacitive coupling (C3) between the magnetic core and the grounding element.

2. Current transducer according to claim 1, wherein the grounding element overlaps the magnetic core to an extent configured to ensure that the capacitive coupling (C3) between the magnetic core and the grounding element is at least 1.3 times greater than the capacitive coupling (C1) between the primary conductor and the magnetic core.

3. Current transducer according to claim 2, wherein said portion of the lateral surface of the magnetic core overlapping the grounding element is at least two times greater than said surface area of the magnetic field sensor in the air-gap.

4. Current transducer according to claim 1, wherein the magnetic core is made of a wound strip of thin high magnetic permeability sheet material so as to form stacked concentric ring layers, from a radially innermost ring layer to a radially outermost ring layer, said lateral surface being formed by edges of the wound strip.

5. Current transducer according to claim 1, wherein the magnetic core has an air gap, which completely cuts through the magnetic core.

6. Current transducer according to claim 1, wherein the grounding element comprises a terminal integrally formed with a base portion of the grounding element and configured for direct connection to external circuitry.

7. Current transducer according to claim 6, wherein the terminal is mounted on an elastic beam integrally attached to a base portion.

8. Current transducer according to claim 6, wherein the terminal is in the form of a pin terminal.

9. Current transducer according to claim 1, wherein the grounding element is substantially planar.

10. Current transducer according to claim 1, wherein the grounding element comprises a tab bent out of the base portion and positioned against a face of the magnetic core defining one side of the air gap, the tab comprising a grounding contact configured to contact a grounding pad of a circuit board inserted in the air gap.

11. Current transducer according to claim 1, comprising a plurality of said magnetic cores each configured to receive a primary conductor carrying a primary current to be measured through the central passage of each magnetic core, wherein there is a single said grounding element capacitively coupled to the plurality of magnetic cores.

12. Current transducer according to claim 1, wherein the grounding element comprises positioning elements that cooperate with complementary positioning elements of the housing.

13. Current transducer according to claim 1, wherein the grounding element is positioned on a floor of the housing and the magnetic core is positioned directly against the grounding element.

14. Current transducer according to claim 1, wherein a thin layer of dielectric material separates the magnetic core from the grounding element.

* * * * *